United States Patent
Ramond

(10) Patent No.: US 11,387,826 B1
(45) Date of Patent: Jul. 12, 2022

(54) SHORT CIRCUIT DETECTION CIRCUIT

(71) Applicant: SEMICONDUCTOR COMPONENTS INDUSTRIES, LLC, Phoenix, AZ (US)

(72) Inventor: Stephane Ramond, Mons (FR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 17/249,920

(22) Filed: Mar. 18, 2021

Related U.S. Application Data

(60) Provisional application No. 63/199,351, filed on Dec. 21, 2020.

(51) Int. Cl.
*H03K 17/082* (2006.01)

(52) U.S. Cl.
CPC .................. *H03K 17/0822* (2013.01)

(58) Field of Classification Search
CPC ........... H03K 17/0822; H03K 17/0828; H02H 3/16–165; H02H 3/08
See application file for complete search history.

(56) References Cited

U.S. PATENT DOCUMENTS

| | | |
|---|---|---|
| 2010/0302692 A1 | 12/2010 | Groenewold |
| 2015/0372678 A1 | 12/2015 | Zhang et al. |
| 2015/0380926 A1 | 12/2015 | Zhong et al. |
| 2016/0211657 A1* | 7/2016 | Hayashi .................. H02H 3/08 |
| 2018/0062643 A1* | 3/2018 | Trescases ................ H03K 5/08 |
| 2018/0205372 A1* | 7/2018 | Sasaki .................. H03K 17/168 |

OTHER PUBLICATIONS

Yaopeng Hu, Menglian Zhao, Xuetong Bai, Xiaobo Wu; "A Novel Current Mirror Sensing Based Overcurrent Detection for Buck DC-DC Converter"; conference paper; 2019 IEEE International Conference on Electron Devices and Solid-State Circuits (EDSSC); Xian China; Jun. 2019; 2 pages.

Lang-Yuan Wang, Meng-Lian Zhao, Xiao-Bo Wu; "A Monolithic High-Performance Buck Converter Nith Enhanced Current-Mode Control and Advanced Protection Circuits"; IEEE Transactions on Power Electronics, vol. 31, No. 01, Jan. 2016; 13 pages.

"Current Breaker Activated by an Output Short-Circuit Fault and Deactivated at the Fault Suppression"; white paper, Ip.com, Publication No. 000009810D; Sep. 19, 2002; 3 pages.

"Logic Level"; Wikipedia; white paper article; 4 pages.

* cited by examiner

*Primary Examiner* — Jared Fureman
*Assistant Examiner* — Christopher J Clark
(74) *Attorney, Agent, or Firm* — Polansky & Associates, P.L.L.C.; Paul J. Polansky

(57) ABSTRACT

A method for detecting a short circuit includes driving a transistor in response to a drive signal, forming a drain signal of the transistor, generating an inverted signal in response to the drain signal, generating a detect signal when the inverted signal and a control signal are active, and providing the drive signal in an active logic state when the control signal is active and the detect signal is inactive, and in an inactive logic state otherwise.

25 Claims, 4 Drawing Sheets

US 11,387,826 B1

SHORT CIRCUIT DETECTION CIRCUIT

FIELD OF THE DISCLOSURE

This disclosure relates generally to fault protection circuits, and more specifically to short circuit detection circuits for power transistors.

BACKGROUND

Integrated circuits are covered by various safety mechanisms that place them in a safe state during a circuit fault condition. Gate drivers are circuits that are used to drive a transistor, such as a power transistor in a switched mode power supply, and place them in a desired conductivity state. In order to prevent overheating and damaging either the transistor or the system, short circuit protection circuits are used to turn off the transistor during short circuit conditions. Conventional short circuit protection circuits determine short circuit conditions by comparing the drain-source voltage of the protected transistor to a reference voltage. These short circuit protection circuits often require voltage level shifters, blanking times, and/or additional reference branch circuits. These requirements can increase die size, slow detection times, and/or increase current consumption. It is difficult, therefore, to meet increasingly strict standards for efficiency using known short circuit detection circuits.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
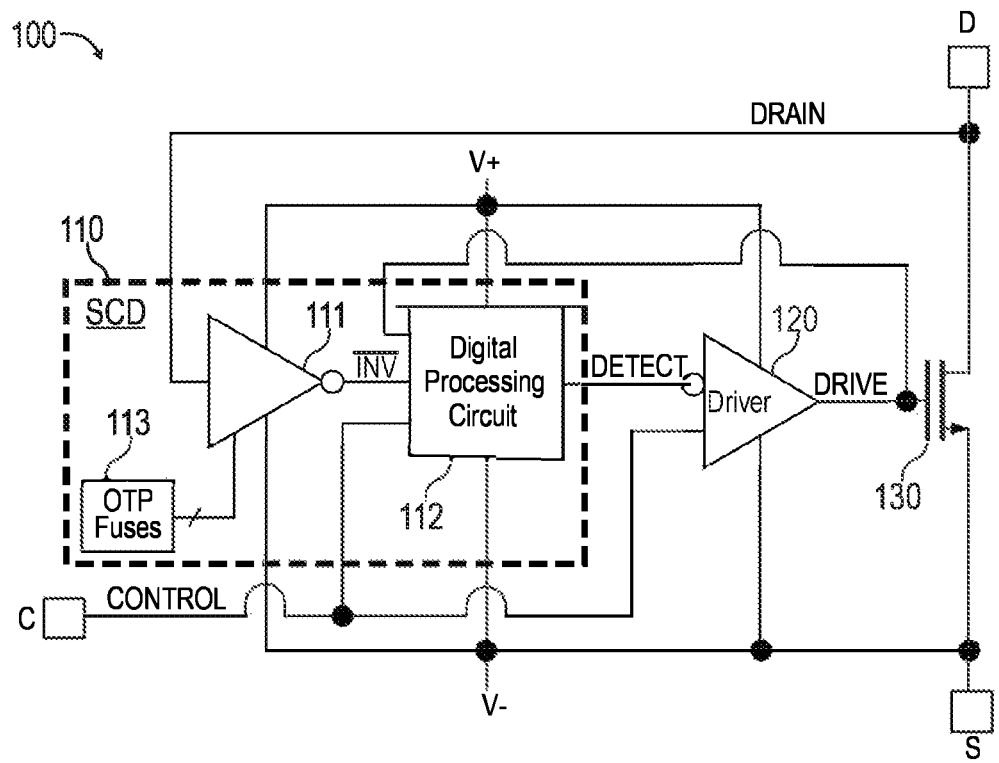
FIG. 1 illustrates in partial block diagram and partial schematic form a gate driver with short circuit detection according to an embodiment of the present disclosure.

FIG. 1 illustrates in partial block diagram and partial schematic form a gate driver 100 with a short circuit detection according to an embodiment of the present disclosure. Gate driver 100 includes generally a set of terminals labeled "C", "D", and "S", a short circuit detection circuit 110, a driver 120, and a transistor 130. Short circuit detection circuit 110 includes an inverter 111, a digital processing circuit 112, and a set of one-time-programmable (OTP) fuses 113. Inverter 111 has a first input for receiving a drain signal labeled "DRAIN", a second input for receiving a programming signal, a first supply terminal for receiving a voltage labeled "V+", a second supply terminal connected to the S terminal for receiving a voltage labeled "V−", and an output for providing an inverted signal labeled "INV". Digital processing circuit 112 has a first input for receiving a drive signal labeled "DRIVE", a second input connected to the output of inverter 111, a third input connected to the C terminal for receiving a control signal labeled "CONTROL", a first supply terminal for receiving V+, a second supply terminal connected to the S terminal, and an output for providing a detect signal labeled "DETECT". Set of OTP fuses 113 has an output connected to the second input of inverter 111 for providing the programming signal. Driver 120 has a first, active low input connected to the output of digital processing circuit 112, a second input for receiving CONTROL, a first supply terminal for receiving V+, a second supply terminal connected to the S terminal, and an output for providing DRIVE. Transistor 130 is a N-channel metal-oxide-semiconductor field-effect transistor (MOSFET) with a gate electrode connected to the output of driver 120, a drain electrode connected to the input of inverter 111, and a source electrode. Gate driver 100 can be used to drive the gate of a transistor that is used in a variety of circuits, including a single switch power converter or a high-side or low-side driver of a synchronous converter. Gate driver 100 can be implemented as a monolithic integrated circuit or can be combined with other components in a single package as a multi-chip module. Transistor 130 is shown as a N-channel MOSFET, however other transistor types can be used.

In the embodiment shown in FIG. 1, short circuit detection circuit 110 and driver 120 are in the same power supply voltage domain. For example, if transistor 130 is a N-channel MOSFET, the first supply terminal receives V+ from an internal supply circuit, not shown in FIG. 1, and the second supply terminal is connected to the source of transistor 130. In embodiments where transistor 130 is a P-channel MOSFET, the first supply terminal is connected to the source of transistor 130 and the second supply terminal receives V− from an internal supply circuit, not shown in FIG. 1. Thus, the driver circuit is biased according to transistor type.

In operation, gate driver 100 drives transistor 130 while improving short circuit fault detection by implementing digital short circuit detection using inverter 111 and digital processing circuit 112. By using digital short circuit detection, gate driver 100 decreases response time and lowers current consumption compared to known fault detection circuits.

In normal operation, i.e. operation with no short circuit, driver 120 receives CONTROL and responsively drives transistor 130 to a conductive state or a non-conductive state via DRIVE according to the state of CONTROL. Transistor 130 conducts a current from its drain terminal to its source terminal in its conductive state. Thus, gate driver 100 controls the switching of transistor 130 in a desired state according CONTROL when no fault condition occurs.

When there is a short circuit condition, such as a short from the source terminal of a high-side transistor to ground, the drain-to-source voltage drop caused by an increased current flowing across the ON resistance of transistor 130 causes the voltage at the input of inverter 111 to rise above its switchpoint. If a short circuit condition occurs, inverter 111 provides INV in an active state to digital processing circuit 112. Digital processing circuit 112 determines from INV, CONTROL, and DRIVE if the short circuit condition occurred while transistor 130 is in its conductive state, and if so, responsively activates DETECT. When DETECT is activated, driver 120 and transistor 130 are disabled for the remainder of the switching cycle. Since the short circuit condition is an external fault, the system implementing gate driver 100 can correct the fault condition using a variety of methods. In this case, short circuit detection circuit 110 checks for the short circuit condition each switching cycle and responsively disables driver 120 and transistor 130 on a cycle-by-cycle basis until the short circuit condition is removed.

Gate drivers implementing digital short circuit detection circuits such as short circuit detection circuit 110 described above have decreased response times and lower current consumption compared to known fault detection circuits. In the embodiment shown in FIG. 1, inverter 111, digital processing circuit 112, and driver 120 are in the same power supply voltage domain, eliminating the need for voltage level shifters. By using inverter 111 to detect the short circuit condition, short circuit detection circuit 110 can be implemented on a smaller die area compared to known fault detection circuits. Since short circuit detection circuit 110 consumes little current it can be used during various low power operations, such as start-up operation or eco-modes. Implementations of short circuit detection circuit 110 using DRIVE as a feedback input to digital processing circuit 112 can be implemented without the use of blanking circuits. Short circuit detection circuit 110 can be adapted to protect transistors in a variety of applications, topologies, and power stage structures.

Figure 2:
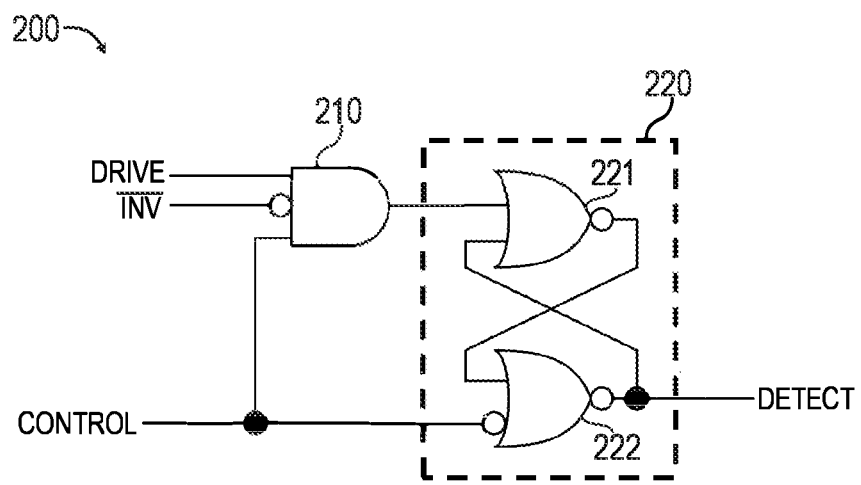
FIG. 2 illustrates in block diagram form a digital processing circuit that can be used as the digital processing circuit of FIG. 1.

FIG. 2 illustrates in block diagram form a digital processing circuit 200 that can be used as the digital processing circuit 112 of FIG. 1. Digital processing circuit 200 includes generally a logic gate 210 and a latch circuit 220. Logic gate 210 is an AND gate with a first input for receiving DRIVE, a second, inverting input for receiving INV, a third input for receiving CONTROL, and an output for providing a set signal. Latch circuit 220 has a set input connected to the output of logic gate 210, a reset input for receiving CONTROL, and an output for providing DETECT. Latch circuit 220 includes a logic gate 221 and a logic gate 222. Logic gate 221 is a NOR gate with a first input connected to the output of logic gate 210, a second input for receiving DETECT, and an output. Logic gate 222 is a NOR gate with a first input connected to the output of logic gate 221, a second, inverting input for receiving CONTROL, and an output for providing DETECT.

In operation, digital processing circuit 200 implements digital short circuit protection when used with a detector such as inverter 111 of FIG. 1. When CONTROL and DRIVE are active (logic high state) and INV is inactive (logic high state), logic gate 210 keeps the set signal inactive (logic low state). If a short circuit condition is detected, INV becomes active (logic low state). If INV is activated when CONTROL and DRIVE are active, logic gate 210 activates the set signal and sets latch circuit 220. When latch circuit 220 is set, DETECT is activated (logic high state) and the gate driver is disabled for the remainder of the switching cycle. Latch circuit 220 is reset at the end of the switching cycle when CONTROL becomes inactive (logic low state). In embodiments using cycle-by-cycle short circuit detection, at the next switching cycle CONTROL and DRIVE are activated. If the short circuit condition persists, INV will remain active, causing latch circuit 220 to activate DETECT and subsequently disable the gate driver for the remainder of the switching cycle.

Figure 3:
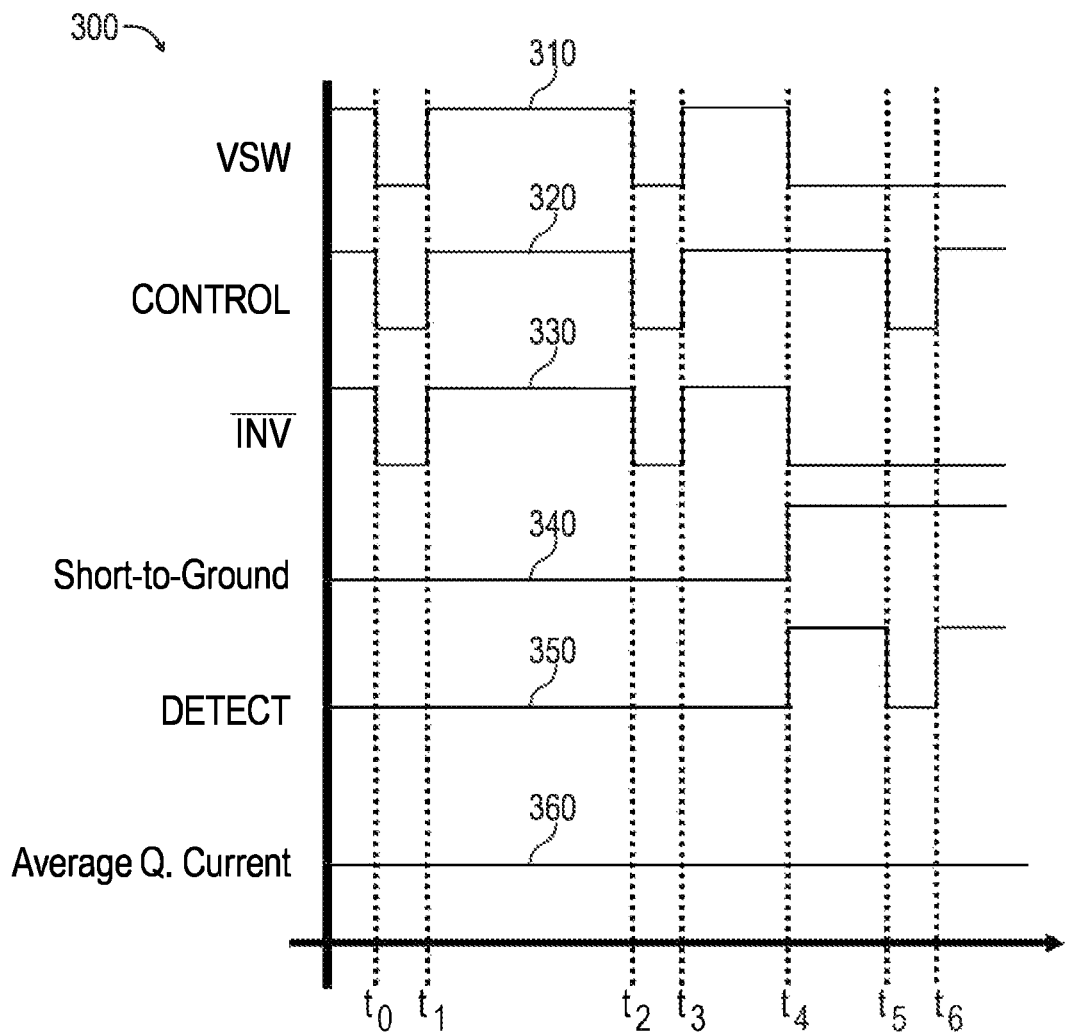
FIG. 3 illustrates a timing diagram showing signals useful in understanding the operation of the gate driver of FIG. 1.

FIG. 3 illustrates a timing diagram 300 showing signals useful in understanding the operation of gate driver 100 of FIG. 1 and digital processing circuit 200 of FIG. 2. In timing diagram 300, the horizontal axis represents time in µs and the vertical axis represents the amplitude of signals in volts or micro-amperes (µA), as the case may be. Timing diagram 300 includes a waveform 310 depicting a voltage at a switching node labeled "VSW", a waveform 320 depicting CONTROL, a waveform 330 depicting INV, a waveform 340 depicting a short-to-ground event labeled "Short-to-Ground", a waveform 350 depicting DETECT, and a waveform 360 depicting the average quiescent current of short circuit detection circuit 110 labeled "Average Q. Current". Waveform 310 represents a direct current (DC) voltage that switches between a high voltage amplitude and low voltage amplitude in accordance with the operation of gate driver 100. Waveforms 320, 330, 340, and 350 represent digital signals with two levels, logic high (high voltage amplitude) and logic low (low voltage amplitude). Waveform 360 represents the average quiescent current measured in µA. The horizontal axis is broken into time intervals at times labeled "$t_0$", "$t_1$", "$t_2$", "$t_3$", "$t_4$", "$t_5$", and "$t_6$".

The operation shown in FIG. 3 begins at $t_0$ with VSW at a low voltage amplitude, and CONTROL, INV, Short-to-Ground, and DETECT in logic low states. At this time, INV is active (logic low state) because the drain-to-source voltage drop of the transistor is above the switchpoint threshold of the inverter; however, DETECT remains inactive (logic low state) since CONTROL and the drive signal indicate that the transistor is disabled. At ti, a switching cycle is initiated and CONTROL is activated (logic high state). After a propagation delay the gate driver turns on the transistor, VSW goes to a high voltage amplitude, and INV becomes inactive (logic high state). At $t_2$, CONTROL is deactivated (logic low state). After a propagation delay the gate driver turns off the transistor, VSW returns to a low voltage amplitude, and INV becomes active. During the on-time from $t_1$ to $t_2$, no short circuit condition is detected and DETECT remains inactive.

The operation continues with a new switching cycle at $t_3$ and the respective signals activating and deactivating as at $t_1$. At $t_4$ a short from the source terminal of the transistor to ground occurs, represented by Short-to-Ground going to a logic high state and VSW going to a low voltage amplitude. When the short circuit condition occurs, the drain-to-source voltage drop caused by an increased current flowing across the ON resistance of the transistor causes the voltage at the input of the inverter to rise above its switchpoint and INV activates. The digital processing circuit determines from CONTROL and INV that the short circuit condition occurred during a switching cycle of the gate driver and responsively activates DETECT. When DETECT becomes active, the gate driver turns off the transistor for the remainder of the switching cycle. At $t_5$, CONTROL is deactivated, and DETECT is reset. At $t_6$, a new switching cycle is initiated, CONTROL is activated, and the gate driver turns on the transistor after a propagation delay. In this example, the short circuit condition persists; therefore, the digital processing circuit reactivates DETECT and the gate driver and transistor are disabled for the remainder of the switching cycle. During the various switching cycles, Average Q. Current remains substantially constant, indicating the short circuit detection circuit has little impact on the average quiescent current when detecting short circuit conditions.

The result of the operation described in FIG. 3 is a short circuit detection circuit with reduced response time. For example, when implemented in 0.18 micron CMOS manufacturing technology, the time between a short circuit condition occurring and the digital processing circuit activating DETECT is less than 3 nanoseconds (ns).

Figure 4:
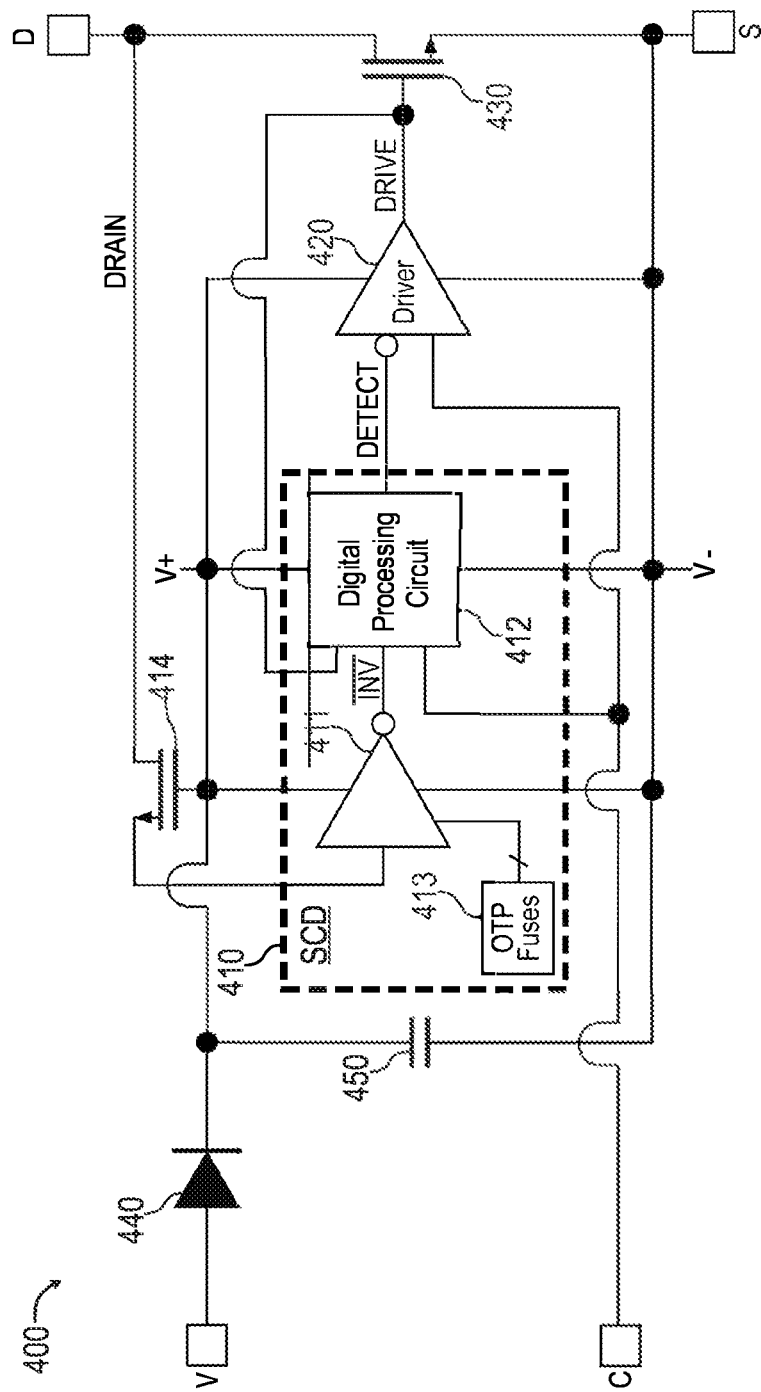
FIG. 4 illustrates in partial block diagram and partial schematic form a gate driver with short circuit detection according to another embodiment of the present disclosure.

FIG. 4 illustrates in partial block diagram and partial schematic form a gate driver 400 with short circuit detection according to another embodiment of the present disclosure. Gate driver 400 operates similarly to gate driver 100 of FIG. 1, but with a few differences described below. Gate driver 400 includes generally a set of terminals labeled "V", "C", "D", and "S", a short circuit detection circuit 410, a bootstrap diode 440, a bootstrap capacitor 450, and respective elements found in gate driver 100 of FIG. 1. Short circuit detection circuit 410 includes a cascode transistor 414 and respective elements found in short circuit detection circuit 110 of FIG. 1. Cascode transistor 414 is a N-channel MOSFET with a drain connected to the drain of transistor 430, a gate connected to the first supply terminal for receiving V+, and a source connected to the input of inverter 411. Bootstrap diode 440 has an anode connected to the V terminal for receiving an internal supply voltage labeled "PVDD" from an internal supply circuit, not shown in FIG. 4, and a cathode connected to the first supply terminal. Bootstrap capacitor 450 has a first terminal connected to the cathode of bootstrap diode 440 and a second terminal connected to the second supply terminal. In this embodiment, since transistor 430 is a N-channel MOSFET, the second supply terminal is connected to the source of transistor 430.

Gate driver 400 operates similarly to gate driver 100 of FIG. 1, except with the following differences. Transistor 430 is a high voltage transistor with a drain-source voltage higher than the maximum input voltage of inverter 411. When transistor 430 is off, V− is held at ground, allowing bootstrap diode 440 to charge the potential of bootstrap capacitor 450 to PVDD. When CONTROL goes high, the high level of DRIVE starts to charge the gate of transistor 430. During this time, charge is removed from bootstrap capacitor 450 and delivered to the gate of transistor 430. As transistor 430 turns on, V− approaches the drain voltage, bringing V+ near the sum of the drain voltage and PVDD. This provides a sufficient gate-source voltage for transistor 430 to remain conductive while keeping the operating voltage of inverter 411, digital processing circuit 412, and driver 420 within their respective operating limits. During the period where the gate of transistor 430 is charging and V− has not reached the drain voltage, the voltage difference between the drain voltage and V− can be larger than the maximum input voltage of inverter 411. For example, the voltage difference could be 40V and the maximum input voltage of inverter 411 could be 5V. In order to protect inverter 411, cascode transistor 414 limits the input voltage of inverter 411 to V+.

In the embodiment of FIG. 4, transistor 430 is a high voltage N-channel MOSFET; however, other embodiments of high voltage circuits can use other forms of transistors with an appropriate supporting circuit and protective transistor. For example, if transistor 430 were a P-channel MOSFET, cascode transistor 414 would also be a P-channel MOSFET. In this example, cascode transistor 414 would have a drain connected to the drain of transistor 430, a gate connected to the second supply terminal for receiving V−, and a source connected to the input of inverter 411. In this example, bootstrap diode 440 and bootstrap capacitor 450 are not used. Furthermore, since transistor 430 is a P-channel MOSFET, the first supply terminal is connected to the source of transistor 430. Thus, inverter 411 is protected according to transistor and application types.

Figure 5:
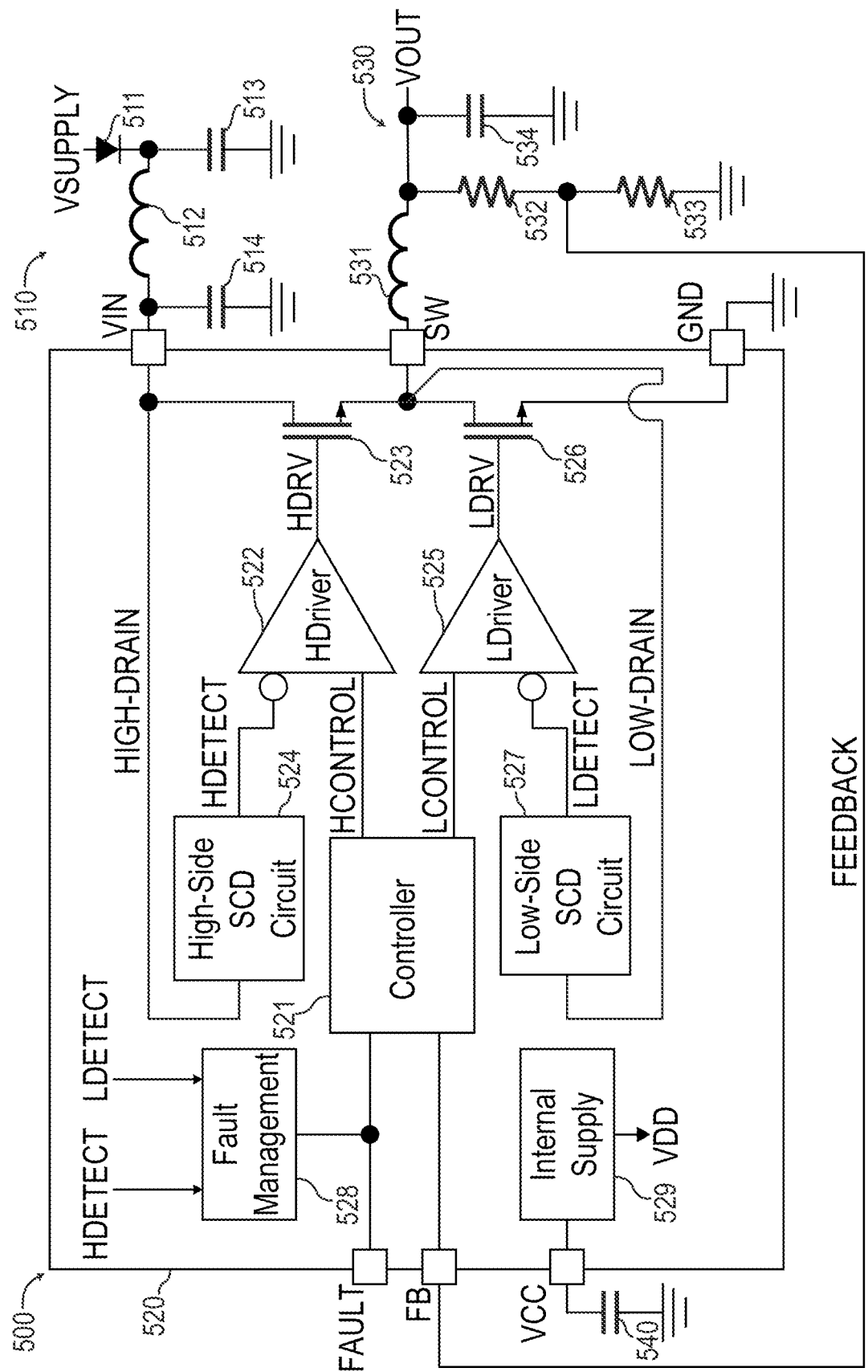
FIG. 5 illustrates in partial block diagram and partial schematic form a switched mode power supply with short circuit detection using the short circuit detection circuit of FIG. 1 or FIG. 4 according to an embodiment of the present disclosure.

FIG. 5 illustrates in partial block diagram and partial schematic form a switched mode power supply 500 with short circuit detection using the short circuit detection circuits of FIG. 1 or FIG. 4 according to an embodiment of the present disclosure. Switched mode power supply 500 is a DC-DC buck converter that uses short circuit detection to improve system protection. Switched mode power supply 500 includes generally an input circuit 510, a switched mode power converter 520, an output circuit 530, and a supply capacitor 540.

Input circuit 510 includes an input diode 511, an input inductor 512, and input capacitors 513 and 514. Input diode 511 has an anode for receiving a supply voltage labeled "VSUPPLY" from a DC supply, not shown in FIG. 1, and a cathode. Input inductor 512 has a first terminal connected to the cathode of input diode 511 and a second terminal. Input capacitor 513 has a first terminal connected to the cathode of input diode 511 and a second terminal connected to power ground. Input capacitor 514 has a first terminal connected to the second terminal of input inductor 512 and a second terminal connected to ground.

Switched mode power converter 520 is an integrated circuit buck converter that regulates an output voltage of switched mode power supply 500. Switched mode power converter 520 has a set of terminals labeled "VIN", "SW", "FAULT", "FB", "VCC", and "GND". The VIN terminal is connected to the second terminal of input inductor 512. The FAULT terminal is connected to an external circuit, not shown in FIG. 5, for providing a fault signal. The GND terminal is connected to ground.

Switched mode power converter 520 includes generally a controller 521, a high-side driver 522, a high-side transistor 523, a high-side short circuit detection circuit 524, a low-side driver 525, a low-side transistor 526, a low-side short circuit detection circuit 527, a fault management circuit 528, and an internal supply circuit 529. Controller 521 has a feedback input connected to the FB terminal, a fault input connected to the FAULT terminal, a high-side output for providing a high-side control signal labeled "HCONTROL", and a low-side output for providing a low-side control signal labeled "LCONTROL". High-side driver 522 has an enable input, a control input connected to the high-side output of controller 521, and an output for providing a high-side drive signal labeled "HDRV". High-side transistor 523 has a gate connected to the output of high-side driver 522, a drain connected to the VIN terminal, and a source connected to the SW terminal. High-side short circuit detection circuit 524 has an input connected to the drain of high-side transistor 523 for receiving a high-side drain signal labeled "HIGHDRAIN" and an output connected to the enable input of high-side driver 522 for providing a high-side detection signal labeled "HDETECT". Low-side driver 525 has a control input connected to the low-side output of controller 521, an enable input, and an output for providing a low-side drive signal labeled "LDRV". Low-side transistor 526 has a gate connected to the output of low-side driver 525, a drain connected to the SW terminal, and a source connected to the GND terminal. Low-side short circuit detection circuit 527 has an input connected to the drain of low-side transistor 526 for receiving a low-side drain signal labeled "LOWDRAIN" and an output connected to the enable input of low-side driver 525 for providing a low-side detection signal labeled "LDETECT". Fault management circuit 528 has a first input connected to the output of high-side short circuit detection circuit 524, a second input connected to the output of low-side short circuit detection circuit 527, and an output connected to the FAULT terminal for providing a fault signal. Internal supply circuit 529 has an input connected to the VCC terminal and an output for providing an internal voltage labeled "VDD".

Output circuit 530 includes an output inductor 531, feedback resistors 532 and 533, and output capacitor 534. Output inductor 531 has a first terminal connected to the SW terminal of switched mode power converter 520 and a second terminal for providing an output voltage labeled "VOUT" to a load, not shown in FIG. 5. Feedback resistor 532 has a first terminal connected to the second terminal of output inductor 531 and a second terminal connected to the FB terminal of switched mode power converter 520 for providing a feedback signal labeled "FEEDBACK". Feedback resistor 533 has a first terminal connected to the second terminal of feedback resistor 532 and a second terminal connected to ground. Output capacitor 534 has a first terminal connected to the second terminal of output inductor 531 and a second terminal connected to ground. Supply capacitor 540 has a first terminal connected to the VCC terminal of switched mode power converter 520 and a second terminal connected to ground.

In operation, input circuit 510 smooths VSUPPLY at the input of switched mode power supply 500. Output capacitor 534 stabilizes VOUT, the output voltage of switched mode power supply 500. Switched mode power converter 520 charges supply capacitor 540 via the VCC terminal during a startup period and is powered by supply capacitor 540.

Feedback circuit 530 provides FEEDBACK as a scaled down representation of VOUT to the FB terminal of switched mode power converter 520. Controller 521 uses FEEDBACK to develop HCONTROL and LCONTROL. High-side driver 522 receives HCONTROL and responsively drives high-side transistor 523 to a conductive state and to a non-conductive state via HDRV. High-side transistor 523 provides a positive current into output inductor 531 when in its conductive state. Low-side driver 525 receives LCONTROL and responsively drives low-side transistor 526 to a conductive state and to a non-conductive state via LDRV. Low-side transistor 526 provides a negative current into output inductor 531 when in its conductive state. Collectively controller 521, high-side driver 522, and low-side driver 525 alternately control the switching of high-side transistor 523 and low-side transistor 526 to regulate VOUT to a desired voltage.

During this operation, if a short circuit condition occurs in the output the system can be damaged. Unlike known switched mode power supplies, however, switched mode power supply 500 implements digital short circuit detection as described previously. High-side short circuit detection circuit 524 senses HIGH-DRAIN. When high-side transistor 523 is conducting and a short circuit condition occurs, high-side short circuit detection circuit 524 activates HDETECT, disabling high-side driver 522 and high-side transistor 523 for the remainder of the switching cycle. Low-side short circuit detection circuit 527 senses LOW-DRAIN. When low-side transistor 526 is conducting and a short circuit condition occurs, low-side short circuit detection circuit 527 activates LDETECT, disabling low-side driver 525 and low-side transistor 526 for the remainder of the switching cycle. Fault management circuit 528 receives both HDETECT and LDETECT and responsively forms the fault signal.

The embodiment of FIG. 5 shows an example switched mode power supply 500 using digital short circuit detection.

In the embodiment of FIG. 5, transistors 523 and 526 are N-channel MOSFETs; however, other embodiments can implement different types of MOSFETs. For example, one embodiment can use a P-channel MOSFET for high-side transistor 523. Short circuit detection circuits 524 and 527 can use any of the various embodiments of short circuit detection circuits described. For example, in one embodiment high-side transistor 523 is a high drain voltage N-channel MOSFET. In this example, high-side short circuit detection circuit 524 resembles short circuit detection circuit 410 of FIG. 4. In the embodiment of FIG. 5, fault management circuit 528 forms the fault signal in response to either HDETECT or LDETECT. In one embodiment of switched mode power converter 520, controller 521 ceases generating HCONTROL and LCONTROL in response to the fault signal. In this example, controller 521 can refrain from generating HCONTROL and LCONTROL either until an external signal is provided to switched mode power converter 520, switched mode power converter 520 is restarted, or a predetermined time passes. In another embodiment, the fault signal is provided to an external controller via the FAULT terminal. Switched mode power converter 520 is described with reference to various terminals and internal circuits; however, implementations of switched mode power converter 520 can include additional circuits or terminals not described within this disclosure while implementing digital short circuit detection. While switched mode power supply 500 shows a buck converter topology, in embodiments of the described short circuit detection circuit can be used in other topologies.

Various embodiments of short circuit detection circuits and their associated systems have been described above wherein an inverter and digital processing circuit detect a short circuit condition. For example, in one embodiment, the short circuit detection circuit detects a short circuit condition by monitoring the drain of a transistor. In another embodiment, the short circuit detection circuit detects a short circuit by monitoring the drain of a high voltage transistor. In yet another embodiment, multiple short circuit detection circuits are used to monitor respective drains of transistors in a power supply.

The above-disclosed subject matter is to be considered illustrative, and not restrictive, and the appended claims are intended to cover all such modifications, enhancements, and other embodiments that fall within the true scope of the claims. For example particular blocks of a gate driver or switched mode power supply can vary in different embodiments. Moreover the short circuit detection circuit, gate driver, digital processing circuit, and switched mode power supply above can be used in different architectures. For example, various embodiments of short circuit detection circuits can be implemented in both single power transistor applications and multiple power transistor applications. Furthermore, short circuit detection circuit described above may be implemented in a standalone gate driver, a switched mode power controller, a switched mode power converter, or another application for protecting a transistor.

Thus, to the maximum extent allowed by law, the scope of the present invention is to be determined by the broadest permissible interpretation of the following claims and their equivalents, and shall not be restricted or limited by the forgoing detailed description.

What is claimed is:

1. A gate driver with short circuit protection for driving a gate of a first transistor having a drain and a source, comprising:

an inverter having an input for receiving a drain signal from the drain of the first transistor and an output for providing an inverted signal;
a digital processing circuit having a first input coupled to said output of said inverter, a second input for receiving a control signal, and an output for providing a detect signal, wherein said digital processing circuit provides said detect signal in an active logic state in response to said inverted signal and control signal being in respective active states; and
a driver having a first input coupled to said output of said digital processing circuit, a second input for receiving said control signal, and an output for providing a drive signal, wherein said driver provides said drive signal in an active logic state when said control signal is active and said detect signal is inactive, and in an inactive logic state otherwise.

2. The gate driver of claim 1, wherein said inverter has a programmable switchpoint.

3. The gate driver of claim 2, further comprising a plurality of fuses coupled to said inverter for determining said programmable switchpoint.

4. The gate driver of claim 1, wherein said inverter, said digital processing circuit, and said driver are in a first power supply voltage domain.

5. The gate driver of claim 1, wherein said digital processing circuit comprises:
a logic gate responsive to said inverted signal and said control signal to provide a set signal; and
a latch circuit set in response to said set signal and reset in response to said control signal.

6. The gate driver of claim 5, wherein:
said latch circuit is set in response to said control signal and said inverted signal being active; and
wherein said latch circuit is reset when said control signal is inactive.

7. The gate driver of claim 6, wherein said latch circuit is further set in response to said drive signal being active.

8. The gate driver of claim 1 further comprising a second transistor having a drain for receiving said drain signal, a source coupled to said input of said inverter, and a gate coupled to a power supply voltage terminal, wherein said inverter, said digital processing circuit, and said driver are coupled to said power supply voltage terminal.

9. The gate driver of claim 1 wherein said inverter, said digital processing circuit, said driver, and the first transistor are combined in a monolithic integrated circuit.

10. A circuit comprising a switching converter, the switching converter comprising:
a controller for providing a first control signal in response to a feedback signal;
a first driver for providing a first drive signal in response to said first control signal;
a first transistor for conducting a first current into an inductive load in response to said first drive signal, wherein a drain of said first transistor forms a first drain signal; and
a first short circuit detection circuit comprising:
a first inverter for providing a first inverted signal in response to said first drain signal; and
a first digital processing circuit that provides a first detect signal in an active state when said first inverted signal and said first control signal are in respective active states,
wherein said first driver provides said first drive signal in an active logic state when said first control signal is active and said first detect signal is inactive, and in an inactive logic state otherwise.

11. The circuit of claim 10, wherein said first inverter has a programmable switchpoint.

12. The circuit of claim 11, wherein said first short circuit detection circuit further comprises a plurality of fuses coupled to said first inverter for determining said programmable switchpoint.

13. The circuit of claim 10, wherein said first digital processing circuit comprises a logic gate responsive to said first inverted signal and said first control signal to provide a set signal in an active logic state in response to said first inverted signal and said first control signal being active.

14. The circuit of claim 13, wherein said first digital processing circuit further comprises a latch circuit responsive to said set signal and said first control signal to provide said first detect signal in said active logic state in response to both said set signal and said first control signal being active.

15. The circuit of claim 13, wherein said logic gate provides said set signal further in response to said first drive signal.

16. The circuit of claim 10, wherein said controller, said first driver, said first transistor, and said first short circuit detection circuit are combined within a single integrated circuit die.

17. The circuit of claim 10, wherein said controller provides a second control signal in response to said feedback signal, the switching converter further comprising:
a second driver for providing a second drive signal in response to said second control signal; and
a second transistor for conducting a second current into said inductive load in response to said second drive signal.

18. The circuit of claim 17, wherein a drain of said second transistor forms a second drain signal, the switching converter further comprising a second short circuit protection circuit comprising:
a second inverter for providing a second inverted signal in response to said second drain signal; and
a second digital processing circuit that provides a second detect signal in an active state when said second inverted signal and said second control signal are in respective active states,
wherein said second driver provides said second drive signal in an active logic state when said second control signal is active and said second detect signal is inactive, and in an inactive logic state otherwise.

19. The circuit of claim 17 further comprising:
an inductor for providing an output voltage in response to said first current and said second current; and
a feedback circuit for providing said feedback signal in response to said output voltage.

20. A method for detecting a short circuit:
driving a transistor in response to a drive signal;
forming a drain signal of said transistor;
generating an inverted signal in response to said drain signal;
generating a detect signal when said inverted signal and a control signal are active; and
providing said drive signal in an active logic state when said control signal is active and said detect signal is inactive, and in an inactive logic state otherwise.

21. The method of claim 20, wherein said generating said detect signal comprises forming a set signal when said inverted signal and said control signal are active.

22. The method of claim 21, wherein:
said generating said detect signal further comprises setting a latch (220) in response to said set signal; and
the method further comprises resetting said latch when said control signal is inactive.

23. The method of claim 21, wherein said forming said set signal comprises pulsing said set signal when said drive signal is active.

24. The method of claim 20, wherein said generating said inverted signal comprises using an inverter with a programmable switchpoint, and activating said inverted signal when said drain signal passes said programmable switchpoint.

25. The method of claim 24, further comprising programming said programmable switchpoint using a plurality of fuses coupled to said inverter.

* * * * *